(12) United States Patent
Wu

(10) Patent No.: US 6,852,453 B2
(45) Date of Patent: Feb. 8, 2005

(54) FABRICATION METHOD FOR SEMICONDUCTOR HOLE

(75) Inventor: Tsung-Hsien Wu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 269 days.

(21) Appl. No.: 10/064,560

(22) Filed: Jul. 26, 2002

(65) Prior Publication Data

US 2003/0228754 A1 Dec. 11, 2003

(30) Foreign Application Priority Data

Jun. 6, 2002 (TW) ........................................ 91112176 A

(51) Int. Cl.⁷ .................................................. G03H 9/00
(52) U.S. Cl. ............................ 430/5; 430/313; 430/314
(58) Field of Search ............................... 430/5, 313–316, 430/394–396; 438/5, 313–316, 394–396

(56) References Cited

U.S. PATENT DOCUMENTS

| | | | | |
|---|---|---|---|---|
| 5,610,754 A | * | 3/1997 | Gheen et al. | 359/210 |
| 6,134,008 A | * | 10/2000 | Nakao | 356/508 |
| 2003/0039893 A1 | * | 2/2003 | Farnsworth et al. | 430/5 |
| 2003/0104319 A1 | * | 6/2003 | Lin et al. | 430/313 |

* cited by examiner

*Primary Examiner*—Duy-Vu N. Deo
(74) *Attorney, Agent, or Firm*—Jianq Chyun IP Office

(57) ABSTRACT

A fabrication method for a semiconductor hole is described. The method provides a circular or a elliptical hole pattern. A first exposure is performed with a first photomask that comprises a plurality of diagonally allocated square patterns wherein the square patterns on the first photomask are tilted at an angle of 45 degrees. Thereafter, a second exposure is performed using a second photomask, wherein patterns on the second photomask are mirror images to those on the second photomask to prevent the peeling of the photoresist at between the diagonally allocated hole patterns.

24 Claims, 6 Drawing Sheets

FABRICATION METHOD FOR SEMICONDUCTOR HOLE

CROSS REFERENCE TO RELATED APPLICATIONS

This application claims the priority benefit of Taiwan application serial no. 91112176, filed Jun. 6, 2002.

BACKGROUND OF INVENTION

1. Field of the Invention

The present invention relates to the patterning of a semiconductor device. More particularly, the present invention relates to a method for forming a semiconductor hole.

2. Background of the Invention

A prevailing tendency in the semiconductor industry is to reduce the design dimension of the circuitry devices. Photolithography thereby becomes a significant step in the entire semiconductor manufacturing. Anything that is related to the structure of a semiconductor device, for example, the patterning of each layer of thin film, the critical dimension is determined by the photolithography process. In other words, the critical dimension of a device is determined by the advancement of the photolithography technique. Thus, the accuracy in the transferring of a photomask pattern plays an important role. If the transferring of a pattern is not accurate, the tolerance of critical dimension of a wafer is affected to lower the resolution of the exposure light.

The proximity effect is a major factor in determining the projection accuracy of a critical dimension onto a wafer surface during the transferring of a mask pattern. The proximity effect, on one hand, is a form of optical distortion associated with the diffraction of light beams when the light beams are being transmitted through the pattern of a photomask to form images on a wafer. On the other hand, proximity effect is a result from the interference between light beams due to the reflection of light from the substrate of a wafer through the photoresist on the wafer surface. The reflected light, however, would lead to multiple exposures to the photoresist, altering the actual amount of exposure light to the photoresist. This type of phenomenon is especially prominent as the line width approaches the wavelength of the light source. Currently, forming a circular or a elliptical hole employs either the optical proximity correction (OPC) or the 2-in-1 exposure method to resolve the above problem.

FIGS. 1A and 2A illustrate the process flow in fabricating a semiconductor hole using the conventional 2-in-1 exposure method. FIGS. 1B and 2B are cross-sectional views of 1A and 2A along the lines 1—1.

FIG. 1A is a schematic diagram illustrating an exposure process, while FIG. 1B is a cross-sectional view of FIG. 1A along the line 1—1.

Referring to FIGS. 1A and 1B, a dielectric layer 102 is formed on a substrate 100. A photoresist layer 104 is formed on the dielectric layer 102. Thereafter, a first photomask (not shown in Figure) is used to perform a first exposure to form a pattern on the photoresist layer 104, wherein the pattern formed on the first photomask comprises square patterns. After the pattern on the first photomask is exposed, the pattern is transferred to the photoresist layer 104 forming two diagonally allocated first regions 106. A second photomask (no shown) is then used to perform a second exposure to form a pattern on the photoresist layer 104, wherein the pattern on the second photomask comprises square patterns. Subsequent to exposing the second photomask, the pattern on the second photomask is transferred to the photoresist layer 104, forming two diagonally allocated second regions 108, wherein the two first regions 106 and the two second regions 108 are mirror images.

FIG. 2A is a schematic diagram illustrating a development process, while FIG. 2B is a cross-sectional view of FIG. 2A along the line 1—1.

Referring to FIGS. 2A and 2B, the photoresist layer 104 in the first regions 106 and the second regions 108 are removed by means of an exposure process to form holes 110 in the photoresist layer 104, exposing the dielectric layer 102.

However, in the above method of forming a hole 110 in a photoresist layer 104a, a leakage of light easily occurs during the first exposure and the second exposure. The double leakage of light will easily lead to the formation of a collapsible column 112 (as shown in FIG. 1A) located between the diagonally allocated first regions 106 and the diagonally allocated second regions 108. The peeling of the photoresist layer is thus resulted and defects in the dielectric layer in the subsequent process are generated. To prevent the collapse of the photoresist layer, the distance between the holes needs to be controlled. Thus, the pattern density can not be increased and further miniaturization of devices is hindered.

SUMMARY OF THE INVENTION

Accordingly, the present invention provides a method for fabricating a hole in a semiconductor device, wherein aerial image contrast at the edges of the holes in each exposure is increased to prevent the peeling of the photoresist between the holes.

The present invention provides a method for fabricating a hole in a semiconductor device, wherein the density of holes can increase.

The present invention provides a method for fabricating a semiconductor hole, wherein the application of optical proximity correction is minimized to simplify the manufacturing process.

Accordingly, the present invention provides a fabrication method for a semiconductor hole, where the desired elliptical or circular hole pattern is accomplished by performing a first exposure using a first photomask that comprises square patterns that are diagonally allocated. A second exposure is also performed using a second mask that also comprises square patterns that are diagonally allocated. Moreover, the square patterns in the first and the second photomasks are mirror images and are tilted at an angle of 45 degrees.

The hole pattern for integrated circuits of the present invention is formed with a photomask having a pattern of square patterns that are rotated a fixed angle of 45 degrees. Compare to using two diagonally allocated square patterns that are not tilted as in the prior art, the method of the present invention can increase the aerial image contrast of the opposing edges of each pair of the diagonally allocated holes. The peeling of the portion of the photoresist between the holes is thus prevented. Further, the present invention can increase the density of the hole pattern. Additionally, the standard required by the product design can be achieved during the photolithography of the wafer. The yield and the productivity are thereby increased. The application of optical proximity correction during the photolithography process is thus reduced to simply the manufacturing process.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1A:
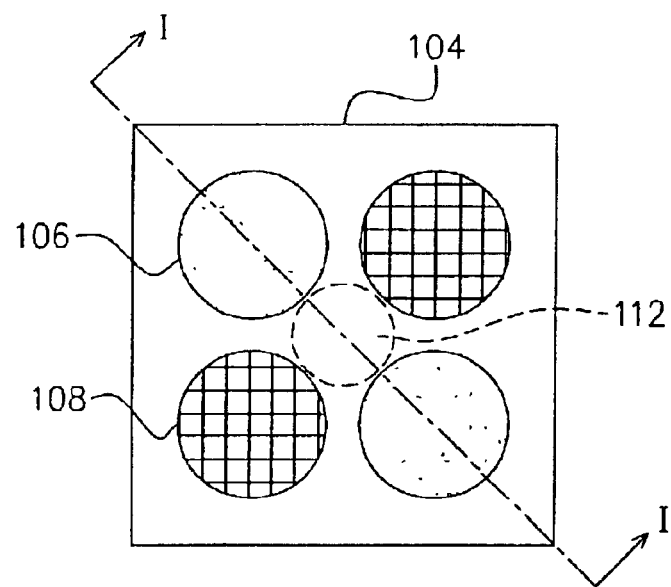
FIGS. 1A, 1B and 2A, 2B illustrate the process flow for manufacturing a semiconductor t hole using a 2-in-1 exposure method according to the prior art.
Figure 1B:
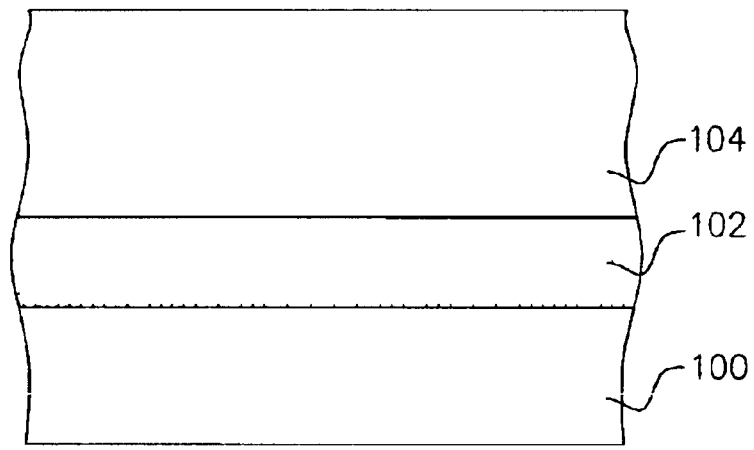
Figure 2A:
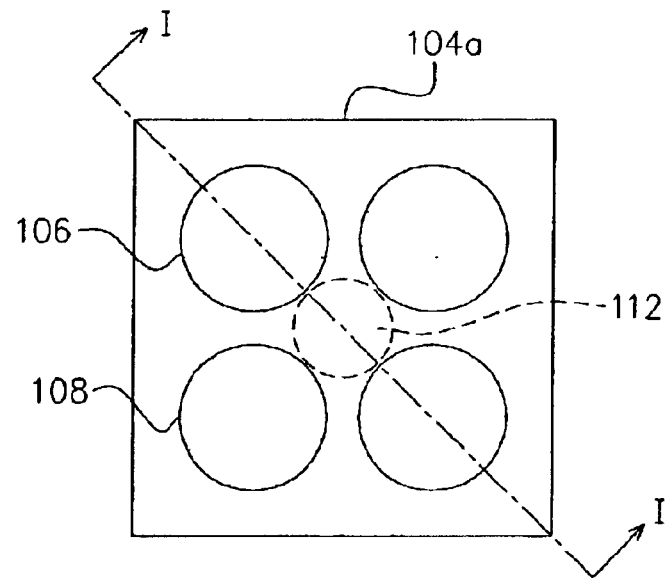
Figure 2B:
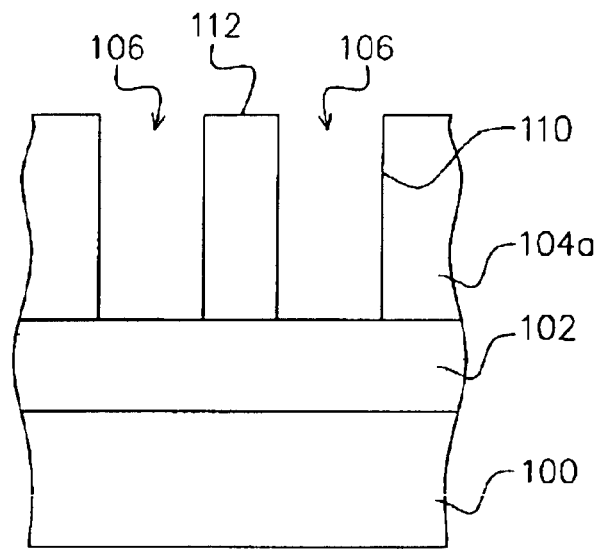
Figure 3:
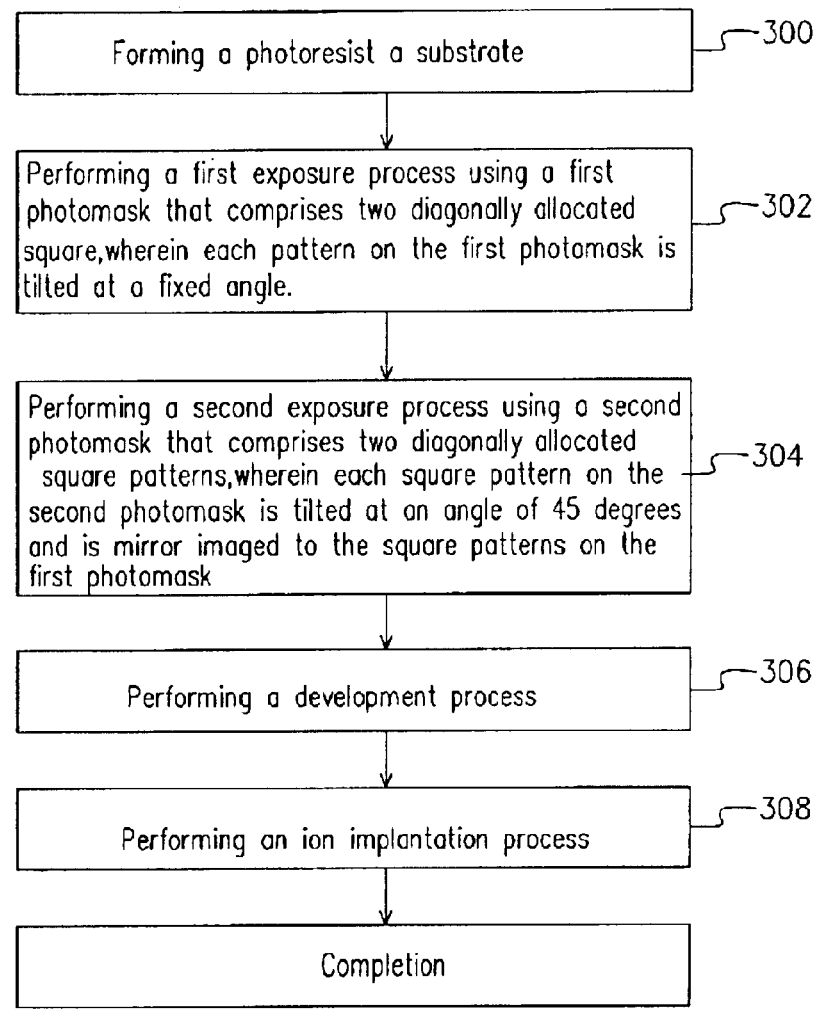
FIG. 3 is a flow diagram illustrating the process flow for fabricating a semiconductor hole according to one embodiment of the present invention.

FIG. 3 a flow diagram illustrating the process flow for fabricating a semiconductor hole according to one embodiment of the present invention.

Referring to FIG. 3, in step 300, a photoresist is formed on a substrate, wherein the substrate comprises, for example, a semiconductor substrate, a semiconductor device, a conductive layer, a dielectric layer, etc. In one example, step 300 can include forming a semiconductor device on a semiconductor substrate, followed by forming a dielectric layer on the semiconductor substrate to cover the semiconductor device. The dielectric layer is then planarized, followed by forming a photoresist layer on the planarized dielectric layer.

Thereafter, in step 302, a first exposure is performed using a first photomask that comprises two diagonally allocated polygon patterns, wherein each polygon pattern on the first photomask is rotated a fixed angle from its arrayed position. The photomask of the present invention comprises square patterns, which are exposed to form either circular or elliptical hole patterns. The fixed angle is, for example, best at about 45 degrees since the shortest distance between the two diagonally distributed square patterns that are tilted at an angle of 45 degrees is the greatest, compared to the shortest distance between two horizontally allocated square patterns. Defects formed due to the leakage of light are more effectively reduced to prevent the peeling of the photoresist near the holes after the development process. Defects are further prevented from forming after the performance of the etching process to form the holes.

After this, in step 304, a second exposure process is conducted using a second photomask that comprises two diagonally allocated polygon patterns that are respectively rotated a fixed angle from their arrayed positions, for example, an angle of 45 degrees. Further, the polygon patterns from the first photomask and the second photomask are mirror images.

Figure 5A:
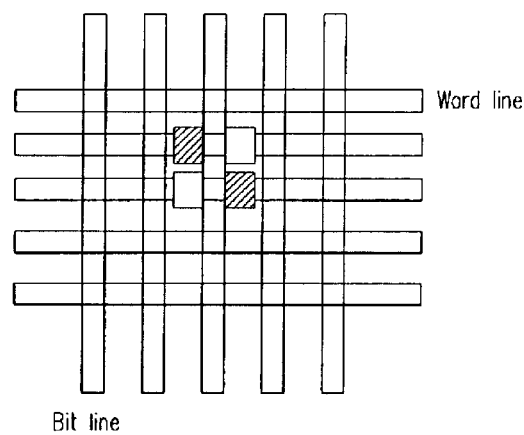
FIG. 5A is a schematic top view of the contact holes formed for the mask ROM coding process by the conventional 2-in-1 exposure process.
Figure 5B:
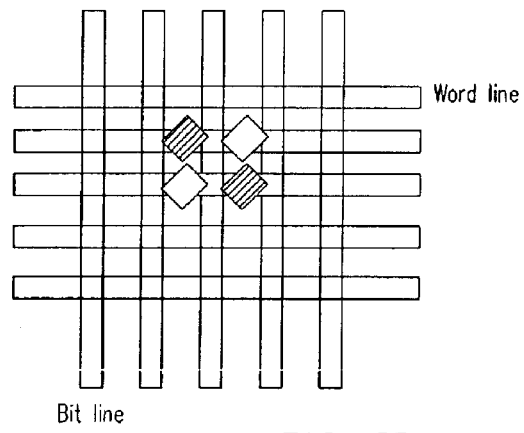
FIG. 5B is a schematic top view of the contact holes formed for the mask ROM coding process by the 45 degree rotation 2-in-1 exposure process of present invention.

In step 306, a development process is performed to form holes in the photoresist. An ion implantation 308 is performed, for example, for a mask ROM coding process. The purpose of the implant in the mask ROM coding process is to turn off the channel, disconnecting the source region from the drain region. As shown in FIGS. 5A and 5B, FIG. 5A is a schematic top view of the contact holes formed for the mask ROM coding process by the conventional 2-in-1 exposure process, while FIG. 5B is a schematic top view of the contact holes formed for the mask ROM coding process by the 45 degree rotation 2-in-1 exposure process of present invention. Moreover, after the contact hole is formed in the photoresist, the photoresist with the hole can be used as a mask to etch the dielectric layer to form contact window in the dielectric layer. Thereafter, the photoresist is removed.

Beside the ion implantation process described in the above embodiment of the present invention in forming the contact window, the present invention is also applicable to a process for etching circular or elliptical patterns or for forming a via hole.

Figure 4:
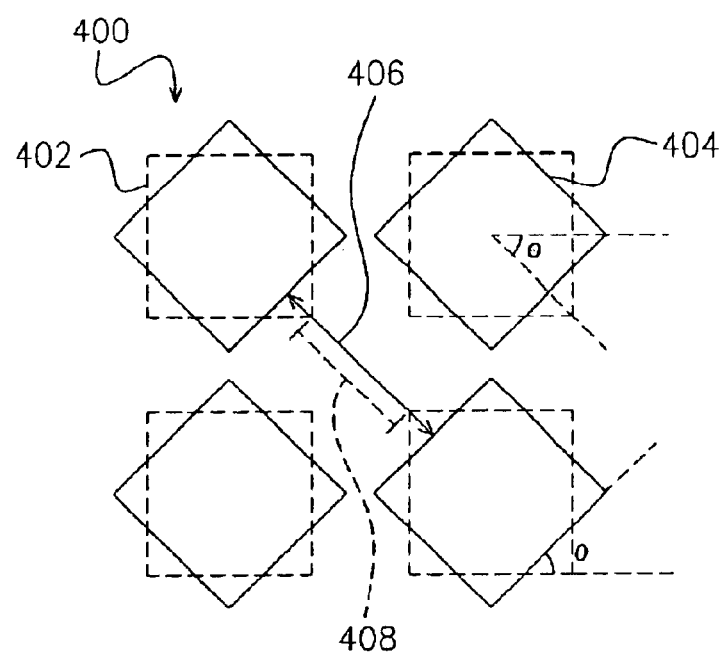
FIG. 4 is a top view of the layout of the semiconductor hole formed according to the one embodiment of the present invention.

To better comprehend the significance of the present invention, please refer to FIG. 4, which is a top view of the layout of the hole formed according to the present invention.

Figure 6:
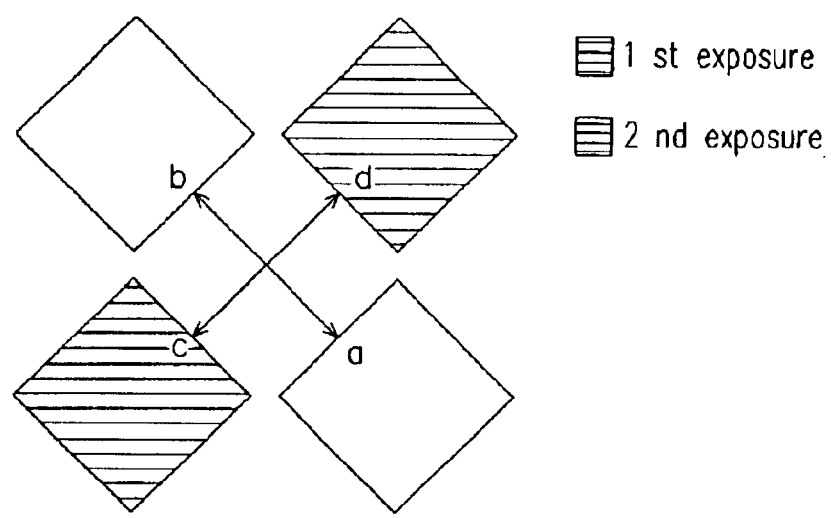
FIG. 6 is a top view of the layout of two pairs of diagonally allocated semiconductor holes illustrating the edge of each hole, where the aerial image contrast is increased according to the present invention.

As shown in FIG. 4, the photomask pattern 400 of the present invention is a photomask pattern that comprises a plurality of square patterns. The shortest distance between the two diagonally allocated square patterns 404 that are rotated a fixed angle of 45 degrees (represented in solid line) is greater than the shortest distance between the two horizontally allocated square patterns as in the prior art. As a result, as shown in FIG. 6, the aerial image contrast of the opposing edges (a vs. b, c vs. d) of each pair of the diagonally allocated contact holes is greatly increased in each exposure. The peeling of the photoresist between the diagonally allocated square patterns due to the leakage of light generated during the exposure process is thus prevented. Moreover, defects that are formed in the patterned dielectric layer in the subsequent etching process are also prevented.

Based on the foregoing, the present invention uses a first and a second photomasks having two diagonally allocated polygon patterns that are rotated 45 degrees from their arrayed positions to perform two exposures. Compared to the holes that are formed with exposing a pattern having horizontally allocated pattern, the contrast of the optical image between the holes can be greatly increased. Defects resulted from the leakage of light is thus reduced.

Further, using two diagonally allocated square patterns that are rotated a fixed angle of 45 degrees as the pattern for the first and the second photomasks can increase the density of the hole patterns.

The present invention uses a first and a second photomasks having two diagonally allocated square patterns that are rotated a fixed angle of 45 degrees to perform two exposure processes. Therefore, it is simpler than the conventional approach that uses optical proximity correction (OPC).

According to the present invention, during the exposure and development processes that are being performed on the wafer, the standard required by the product design is achieved. The yield and the productivity are thereby increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a semiconductor hole, the method is applicable in forming a plurality of holes in a photoresist layer, comprising:

performing a first exposure process on the photoresist layer using a first photomask, wherein the first photomask comprises a plurality of first polygon patterns thereon, and each of the first polygon pattern is rotated a first fixed angle from a first arrayed position;

performing a second exposure process on the photoresist layer using a second photomask, wherein the second photomask comprises a plurality of second polygon patterns thereon, each second polygon pattern is rotated a second fixed angle from a second arrayed position and is mirror imaged to the first polygon patterns; and performing a development process on the photoresist layer to form the holes.

2. The method of claim 1, wherein the first fixed angle and the second fixed angle are about 45 degrees.

3. The method of claim 1, wherein the first and the second polygon patterns are applicable to a photomask used for exposing a positive photoresist.

4. The method of claim 1, wherein after forming the hole, an ion implantation process is performed.

5. The method of claim 4, wherein after the ion implantation process, the photoresist layer is removed.

6. The method of claim 1, wherein after forming the holes, an etching process is performed.

7. The method of claim 6, wherein after the etching process, the method further comprises removing the photoresist layer.

8. An ion implantation process, comprising:

forming a dielectric layer on a substrate;

forming a photoresist layer on the dielectric layer;

performing a first exposure using a first photomask that comprises a plurality of diagonally allocated first polygon patterns, wherein the first polygon patterns are rotated a first fixed angle from a first arrayed position;

performing a second exposure using a first photomask that comprises a plurality of diagonally allocated second polygon patterns, wherein the second polygon patterns are rotated a second fixed angle from a second arrayed position and are mirror imaged to the first square patterns;

performing a development process on the photoresist layer to forming a plurality of holes, wherein a portion of the dielectric layer is exposed; and performing an ion implantation process.

9. The method of claim 8, wherein the fixed angle and the second fixed angle are about 45 degrees.

10. The method of claim 8, wherein the first and the second polygon patterns are applicable to a photomask used for exposing a positive photoresist.

11. The method of claim 8, wherein subsequent to the ion implantation process, the photoresist layer is removed.

12. The method of claim 8, wherein after forming the dielectric layer on the substrate, the method further comprises planarizing the dielectric layer.

13. A method for forming a contact window, comprising:

forming a dielectric layer on a substrate;

forming a photoresist layer on the dielectric layer;

performing a first exposure using a first photomask that comprises a plurality of diagonally allocated first polygon patterns, wherein the first polygon patterns are rotated a first fixed angle from a first arrayed position;

performing a second exposure using a second photomask that comprises a plurality of diagonally allocated second polygon patterns, wherein the second polygon patterns are rotated a second fixed angle from a second arranged position and are mirror imaged to the first polygon patterns;

performing a development process on the photoresist layer to form a plurality of contact holes, wherein a portion of the dielectric layer is exposed; and performing an etching process on the dielectric layer to form a plurality of contact windows using the photoresist layer that comprises the plurality of the contact windows as a mask.

14. The method of claim 13, wherein the that fixed angle and the second fixed angle awe about 45 degrees.

15. The method of claim 14, wherein the polygon patterns are applicable to a photomask used for exposing a positive pattern.

16. The method of claim 13, wherein miter etching the dielectric layer, the photoresist layer is removed.

17. The method of claim 13, wherein after forming the dielectric layer on the substrate, the method further comprises planarizing the dielectric layer.

18. A method for fabricating a semiconductor hole, which is applicable to forming a plurality of holes in a photoresist layer, comprising:

applying a first photomask to perform a first exposure on the photoresist layer, wherein a pattern of the first photomask is a plurality of first square patterns, and each of the first square patterns rotates a first fixed angle from a first arrayed position;

applying a second photomask to perform a second exposure on the photoresist layer, wherein second photomask comprises a plurality of diagonally allocated square patterns, wherein each of the second square patterns rotates a second fixed angle from a second arrayed position and is mirror imaged to the first square patterns; and performing a development process on the photoresist layer to form the holes.

19. The method of claim 18, wherein the first fixed angle and the second fixed angle are about 45 degrees.

20. The method of claim 18, wherein the square patterns are applicable to a photomask used for exposing a positive photoresist.

21. The method of claim 18, wherein subsequent to forming the holes, an ion implantation is performed.

22. The method of claim 21, wherein subsequent to the ion implantation, the photoresist layer is removed.

23. The method of claim 18, wherein subsequent to forming the holes, an etching process is performed.

24. The method of claim 23, wherein subsequent to the etching process, the photoresist layer is removed.

* * * * *